US012538668B2

(12) United States Patent
Gao et al.

(10) Patent No.: US 12,538,668 B2
(45) Date of Patent: Jan. 27, 2026

(54) DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Wenhui Gao, Beijing (CN); Kai Zhang, Beijing (CN); Erlong Song, Beijing (CN); Jianjie Liu, Beijing (CN); Caifeng Zhang, Beijing (CN); Xuejiao Yang, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 544 days.

(21) Appl. No.: 17/764,616

(22) PCT Filed: Apr. 8, 2021

(86) PCT No.: PCT/CN2021/085922
§ 371 (c)(1),
(2) Date: Mar. 29, 2022

(87) PCT Pub. No.: WO2022/213318
PCT Pub. Date: Oct. 13, 2022

(65) Prior Publication Data
US 2024/0074256 A1    Feb. 29, 2024

(51) Int. Cl.
*H10K 59/131* (2023.01)
*H10K 59/123* (2023.01)
*H10K 59/80* (2023.01)

(52) U.S. Cl.
CPC ......... *H10K 59/131* (2023.02); *H10K 59/123* (2023.02); *H10K 59/873* (2023.02)

(58) Field of Classification Search
CPC .. H10K 59/131; H10K 59/123; H10K 59/873; H10K 59/82; H10K 59/1213;
(Continued)

(56) References Cited

U.S. PATENT DOCUMENTS

2014/0339575 A1    11/2014    Chung et al.
2016/0190225 A1*    6/2016    Kim ..................... H10K 50/824
                                                                    438/23
(Continued)

FOREIGN PATENT DOCUMENTS

CN        109634467 A        4/2019
CN        109949703 A        6/2019
(Continued)

OTHER PUBLICATIONS

Written Opinion of Tile International Searching Authority of International Application No. PCT/CN2021/085922 dated Jan. 12, 2022 with English translation,(4p).
(Continued)

*Primary Examiner* — William B Partridge
*Assistant Examiner* — Linda J. Fleck
(74) *Attorney, Agent, or Firm* — Arch & Lake LLP

(57) ABSTRACT

A display panel and a display device; the display panel includes a plurality of bonding pins. At least one bonding pin includes a first bonding electrode disposed on a side of an insulating layer group away from a base substrate, the insulating layer group having a first concave portion, the first bonding electrode having a second concave portion, an orthographic projection of the second concave portion on the base substrate being located within an orthographic projection of the first concave portion on the base substrate. The first bonding electrode includes at least a first conductor layer and a second conductor layer, and the at least one bonding pin further includes a filling portion disposed on a
(Continued)

side of the second concave portion away from the base substrate, which is at least partially within the second concave portion.

19 Claims, 7 Drawing Sheets

(58) Field of Classification Search
CPC ............... H10K 59/124; H10K 77/10; H10K 2102/341; H10D 86/443; H10D 86/60
See application file for complete search history.

(56) References Cited

U.S. PATENT DOCUMENTS

| | | | |
|---|---|---|---|
| 2016/0204184 | A1 | 7/2016 | Park |
| 2016/0284783 | A1* | 9/2016 | Kim ................. H10D 86/441 |
| 2016/0370674 | A1* | 12/2016 | Koo ................. G02F 1/136286 |
| 2018/0323249 | A1 | 11/2018 | Kim et al. |
| 2020/0152905 | A1* | 5/2020 | Kurata ................. G02F 1/1343 |
| 2022/0158122 | A1* | 5/2022 | Lu ................. H10K 59/173 |

FOREIGN PATENT DOCUMENTS

| | | | |
|---|---|---|---|
| CN | 110164879 A | | 8/2019 |
| CN | 110459700 A | * | 11/2019 ............. H10K 71/00 |
| CN | 111048527 A | | 4/2020 |
| CN | 111129036 A | | 5/2020 |
| CN | 111900154 A | | 11/2020 |
| CN | 212135113 U | | 12/2020 |
| CN | 112255849 A | | 1/2021 |
| CN | 213182261 U | | 5/2021 |
| JP | 08234225 A | | 9/1996 |
| JP | 2004094020 A | | 3/2004 |
| JP | 2013152409 A | | 8/2013 |
| JP | 2015065025 A | | 4/2015 |
| JP | 2019192467 A | | 10/2019 |
| KR | 20160076295 A | | 6/2016 |
| KR | 20160150149 A | | 12/2016 |
| WO | 2021128453 A1 | | 7/2021 |

OTHER PUBLICATIONS

Extended European Search Report of Application No. 21935548.4, dated on Dec. 1, 2023.(9P).
JPOA issued in Application No. 2023-519938 mailed Feb. 4, 2025 with English translation, (10p).
Notice of Preliminary Rejection of Korean Application No. 10-2023-7010769 dated Sep. 26, 2025 with English translation, (13p).

* cited by examiner

DISPLAY PANEL AND DISPLAY DEVICE

CROSS-REFERENCE TO RELATED APPLICATIONS

The present disclosure is a national phase entry under 35 U.S.C. § 371 of International Application No. PCT/CN2021/085922, filed on Apr. 8, 2021, the entire contents of which are hereby incorporated by reference in its entirety.

TECHNICAL FIELD

The present disclosure relates to the field of display technology, and in particular, to a display panel and a display device including the display panel.

BACKGROUND

With the rapid development of active-matrix organic light-emitting diode (AMOLED), high resolution and narrow frame have become the direction of the industrial development. As the increase of the resolution of the display panel and the pixel per inch (PPI, i.e., pixel density), the number of bonding electrodes in the bonding area will also increase, which is prone to poor display dark spots after bonding.

It should be noted that the information disclosed in the "BACKGROUND" section is only intended to enhance the understanding of the background of the present disclosure, therefore it may include information that does not constitute the prior art known to those skilled in the art.

SUMMARY

The present disclosure provides a display panel and a display device including the display panel.

According to an aspect of the present disclosure, a display panel is provided, including: a base substrate with a display area and a bonding area provided on at least one side of the display area; an insulating layer group on one side of the base substrate and with a first concave portion, the first concave portion being in the bonding area; and a plurality of bonding pins in the bonding area. At least one of the plurality of bonding pins includes: a first bonding electrode on a side, away from the base substrate, of the insulating layer group, and with a second concave portion, an orthographic projection of the second concave portion on the base substrate being within an orthographic projection of the first concave portion on the base substrate, and where the first bonding electrode includes: at least a first conductor layer and a second conductor layer disposed in a laminated manner, the first conductor layer being on a side, away from the base substrate, of the second conductor layer, metal activity of the first conductor layer being lower than metal activity of the second conductor layer; and a filling portion on a side, away from the base substrate, of the second concave portion, being at least partially within the second concave portion.

According to another aspect of the present disclosure, a display device is provided, including the above-mentioned display panel.

It should be understood that the above general description and the following detailed description are only exemplary and explanatory, and do not limit the present disclosure.

BRIEF DESCRIPTION OF THE DRAWINGS

The appending drawings, which are incorporated into and constitute part of the description, show embodiments consistent with the present disclosure, and explain the principle of the present disclosure together with the description. Obviously, the drawings in the following description only show some of the embodiments of the present disclosure, and other drawings can be obtained from these drawings without creative labor by one of ordinary skill in the art.

DETAILED DESCRIPTION

Figure 1:
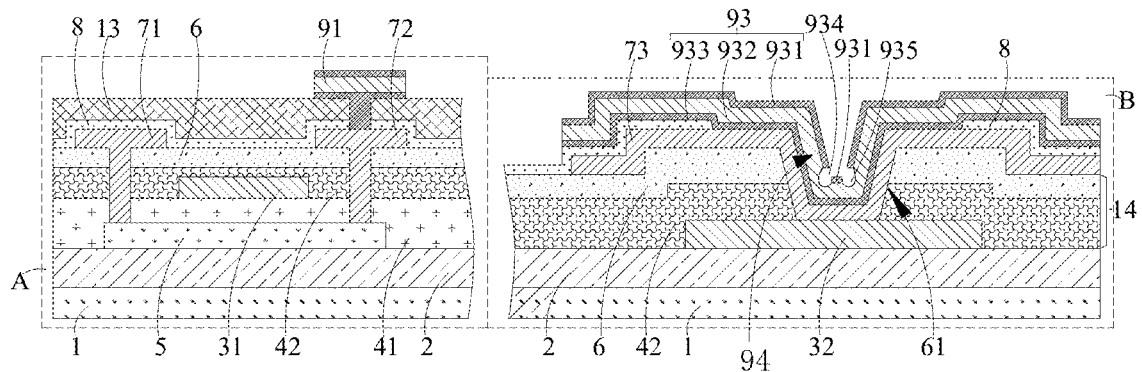
FIG. 1 is a schematic structural diagram of a display panel.

Exemplary embodiments will now be described more fully with reference to the accompanying drawings. The exemplary embodiments, however, can be embodied in various forms and should not be construed as limited to the embodiments set forth herein; on the contrary, these embodiments are provided so that the disclosure will be comprehensive and complete, and will fully convey the concept of the exemplary embodiments to those skilled in the art. The same reference numeral in the drawings represents the same or similar structure, and thus their detailed description will be omitted. Furthermore, the drawings are merely schematic illustrations of the present disclosure, and may not be drawn to scale.

Although the relative terms such as "on" and "under" are used in this description to describe the relative relationship of one component with a numeral with respect to another component, these terms are used in this description only for convenience, such as for illustrating being according to a direction of an example depicted in the accompanying drawing. It can be appreciated that if a device with a numeral is turned upside down, then a component described as "being on" will become the component described as "being under". When a certain structure is "on" other structure, it may mean that the certain structure is integrally formed on the other structure, or the certain structure is "directly" arranged on the other structure, or the certain structure is "indirectly" arranged on the other structure through another structure.

The terms "one", "a/an", "the", "said" and "at least one" are used to indicate the presence of one or more elements/components/etc. The terms "comprise" and "have" (or "provide with") are used to indicate open inclusion and mean that there may be additional elements/components/etc. in addition to the listed elements/components/etc. The terms such as "first", "second" and "third" are only used as numerals, and are not the limitation to the number of their objects.

Referring to FIG. 1, the AMOLED display panel pursues a narrow frame, which is limited by the width of the lower frame of the display panel. Moreover, with the increase of resolution and pixel density, the number of bonding electrodes increases, so that the width of bonding electrodes needs to be set narrower and narrower. At present, multi-layer bonding electrodes connected in parallel are mostly adopted to eliminate the increase of resistance caused by the decrease of the width of bonding electrodes. When the multi-layer bonding electrodes (e.g., a first bonding electrode 93, a second bonding electrode 32 and a third bonding electrode 73) are connected in parallel, a first via hole 61 needs to be formed on an insulating layer to connect the bonding electrodes located on both sides of the insulating layer, therefore it will result in that the first bonding electrode 93 formed above the first via hole 61 forms a second concave portion 94 at the first via hole 61. The film-forming quality of the first bonding electrode 93 on a side wall of the first via hole 61 is poor, and the metal titanium on an upper layer of the first bonding electrode 93 will form a disconnection portion 934, which will result in that the metal titanium on the upper layer of the first bonding electrode 93 cannot wrap the metal aluminum well, and during the subsequent anodic etching process, the Ag+s (silver ions) in the etching solution will undergo the replacement reaction with the exposed Al to generate Ag elemental particles. However, the Ag elemental particles will travel to the display area A of the display panel during the process, resulting in poor display dark spots.

Figure 2:
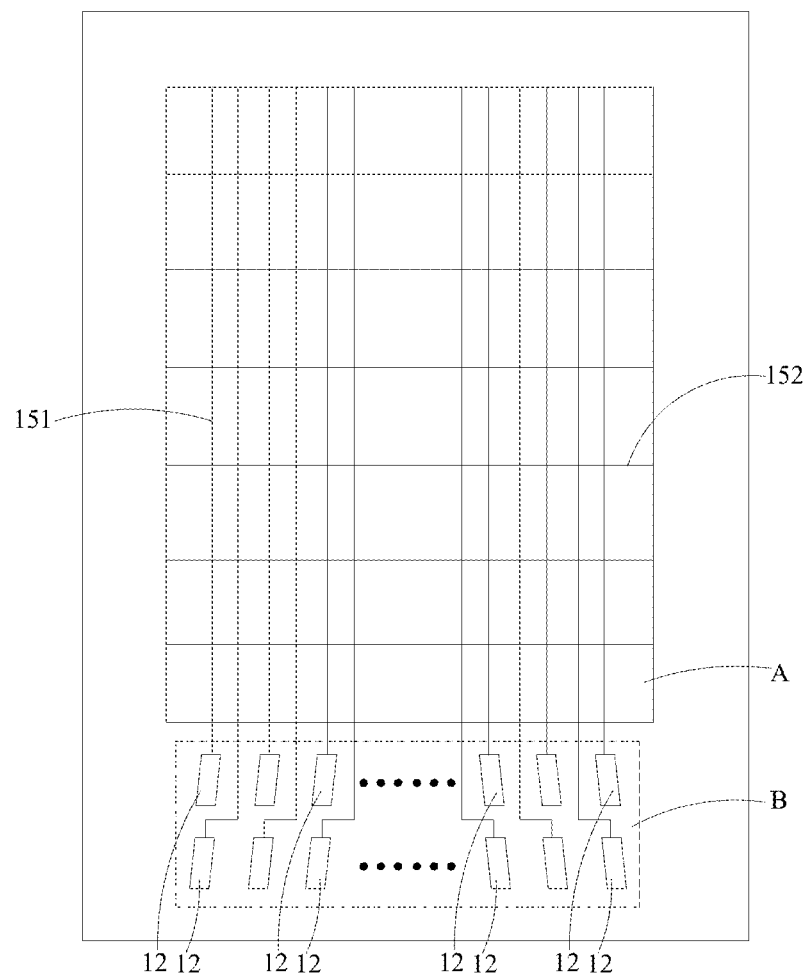
FIG. 2 is a schematic top view of the overall display panel.

Referring to FIG. 2, a plurality of gate lines 152 and a plurality of data lines 151 are arranged in the display area A of the display panel, and a plurality of bonding pins 12 are arranged in the bonding area B. The gate lines 152 extend along a first direction, the data lines 151 extend along a second direction, where the first direction is intersected with the second direction, so that a plurality of gate lines 152 are intersected with a plurality of data lines 151 to form a grid shape. The data lines 151 and the gate lines 152 are connected to the bonding pins 12. In the first direction, a plurality of bonding pins 12 are arranged to form a row. In the second direction, two rows of the bonding pins 12 may be arranged, or, one row of the bonding pins 12 may be arranged, or more rows of bonding pins 12 may be arranged.

The embodiments of the present disclosure provide a display panel, and the schematic structural diagrams of the display panel of the present disclosure are shown in FIG. 3, FIG. 4, FIG. 5, FIG. 6 and FIG. 7. The display panel may include a base substrate 1, an insulating layer group 14 and a plurality of bonding pins 12. The base substrate 1 has a display area A and a bonding area B provided on at least one side of the display area A. The insulating layer group 14 is disposed on a side of the base substrate 1 and provided with a first concave portion 61. The first concave portion 61 is located within the bonding area B. The plurality of bonding pins 12 are provided in the bonding area B. One bonding pin includes a first bonding electrode 93 disposed on a side of the insulating layer group 14 away from the base substrate 1 and provided with a second concave portion 94, an orthographic projection of the second concave portion 94 on the base substrate 1 being within an orthographic projection of the first concave portion 61 on the base substrate 1, where the first bonding electrode 93 includes at least a first conductor layer 931 and a second conductor layer 932 that are arranged in a laminated manner, the first conductor layer 931 being disposed on a side of the second conductor layer 932 away from the base substrate 1, the metal activity of the first conductor layer 931 being lower than that of the second conductor layer 932; and a filling portion 101 provided on a side of the second concave portion 94 away from the base substrate 1, being at least partially located within the second concave portion 94.

In the display panel and the method for preparing the display panel of the present disclosure, the filling portion 101 is provided on a side of the second concave portion 94 away from the base substrate 1, and is at least partially located within the second concave portion 94. The filling portion 101 can protect the exposed second conductor layer 932 to avoid that during the subsequent anodic etching process the Ag+ s(silver ions) in the etching solution undergoes the replacement reaction with the exposed second conductor layer 932 to generate Ag elemental particles, and avoid poor display dark spots caused by the Ag elemental particles traveling to the display area A of the display panel during the process. Moreover, the provided filling portion 101 can increase the structural strength of the bonding pin 12 to further prevent the bonding pin 12 from breaking during the bonding process.

In the present exemplary embodiment, the base substrate 1 may be a glass plate, a quartz plate, a metal plate, a resin plate, etc. For example, the material of the base substrate 1 may include an organic material, and the organic material may be resin materials such as polyimide, polycarbonate, polyacrylate, polyetherimide, polyethersulfone, polyethylene terephthalate and polyethylene naphthalate. For example, the base substrate 1 may be formed of a plurality of material layers, e.g., the base substrate 1 may include a substrate, the material of which may be composed of the above materials.

A buffer layer 2 may be formed on a surface on a side of the base substrate 1 as a transition layer, which can not only prevent harmful substances in the base substrate 1 from invading the interior of the display panel, but also increase the adhesion of the film layers in the display panel on the base substrate 1. For example, the material of the buffer layer 2 may be silicon oxide, silicon nitride, silicon oxynitride, etc.

The base substrate 1 has the display area A and a peripheral area at least partially surrounding the display area A. Further, the peripheral area includes at least one bonding area B on at least one side of the display area A. Alternatively, the peripheral area may include a plurality of bonding areas B on a side of the display area A, or may include a plurality of bonding areas B on a plurality of sides of the display area A.

Figure 7:
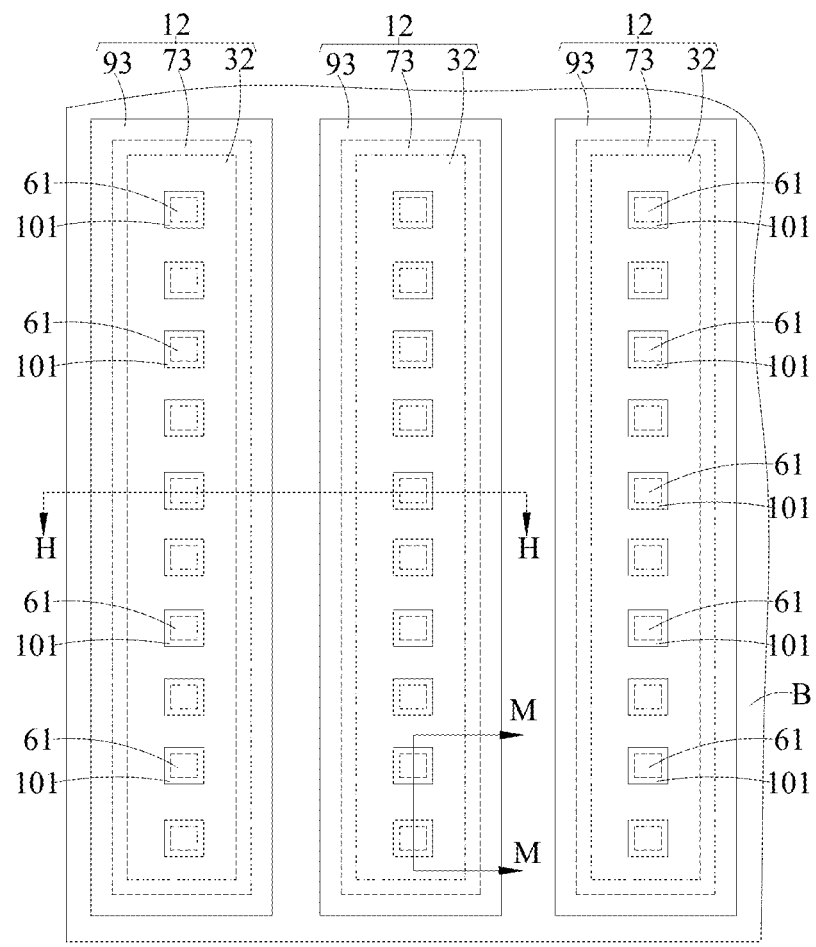
FIG. 7 is a schematic top view of part of bonding pins in a bonding area of a display panel according to an exemplary embodiment of the present disclosure.
Figure 9:
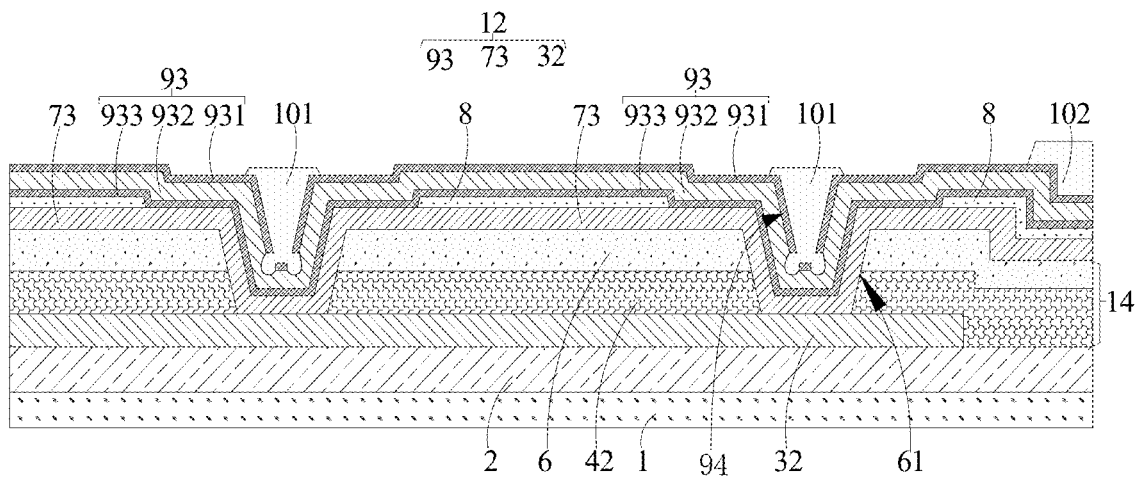
FIG. 9 is a schematic cross-sectional diagram along the M-M section in FIG. 7.

Referring to FIG. 7, a plurality of bonding pins 12 are provided in the bonding area B. Referring to FIG. 7 and FIG. 9, one bonding pin is provided with a plurality of first via holes 61 and a plurality of filling portions 101.

The bonding pin 12 may include a second bonding electrode 32, a third bonding electrode 73 and the first bonding electrode 93 that are disposed sequentially in a laminated manner. The second bonding electrode 32 is closer to the base substrate 1 than the first bonding electrode 93. The third bonding electrode 73 is connected with the second bonding electrode 32 through the first via hole 61.

Figure 11:
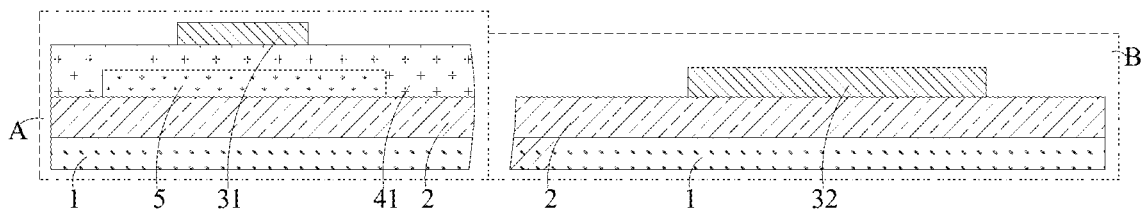
FIG. 11 is a schematic structural diagram of a step of a method for preparing a display panel according to an exemplary embodiment of the present disclosure.
Figure 12:
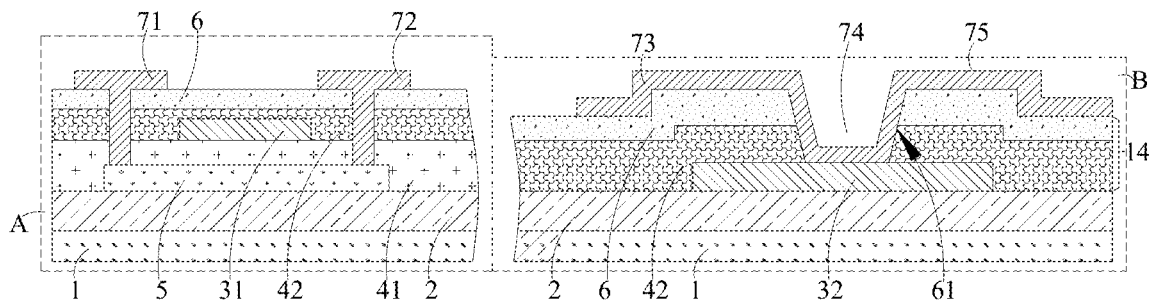
FIG. 12 is a schematic structural diagram of a step of a method for preparing a display panel according to an exemplary embodiment of the present disclosure.

Specifically, as shown in FIG. 11, the second bonding electrode 32 is disposed on a side of the buffer layer 2 away from the base substrate 1. Referring to FIG. 12, a second gate insulating layer 42 is disposed on a side of the second bonding electrode 32 away from the base substrate 1, an interlayer dielectric layer 6 is disposed on a side of the second gate insulating layer 42 away from the base substrate 1, and the second gate insulating layer 42 and the interlayer dielectric layer 6 form the insulating layer group 14, that is, the insulating layer group 14 is disposed in a same layer and made of a same material as the second gate insulating layer 42 and the interlayer dielectric layer 6. A plurality of first via holes 61 are provided on the second gate insulating layer 42 and the interlayer dielectric layer 6. The first via hole 61 forms the first concave portion 61 and is connected to the second bonding electrodes 32, that is, the first via hole 61 penetrates the second gate insulating layer 42 and the interlayer dielectric layer 6. In other exemplary embodiments of the present disclosure, the insulating layer group 14 may also include the buffer layer and a first gate insulating layer, that is, the insulating layer group 14 is disposed in a same layer and a same material as the buffer layer and the first gate insulating layer; the insulating layer group 14 may also include various insulating layers such as a passivation layer, a planarization layer, etc., that is, the insulating layer group 14 may include one or more insulating layers, for example, the insulating layer group 14 may include one or more of a passivation layer, a planarization layer, a gate insulating layer and an interlayer dielectric layer, etc. The insulating layer group 14 may be an organic insulating layer, an inorganic insulating layer, or a mixed layer group of an organic insulating layer and an inorganic insulating layer.

Referring to FIG. 12 again, the third bonding electrode 73 is disposed on a side of the interlayer dielectric layer 6 away from the base substrate 1. The third bonding electrode 73 is electrically connected to the second bonding electrode 32 through a plurality of first via holes 61. The third bonding electrode 73 forms a third concave portion 74 at a second via hole 81. Due to the filling of the side wall of the first via hole 61 by the third bonding electrode 73, an orthographic projection of the third concave portion 74 on the base substrate 1 is located within an orthographic projection of the first via hole 61 on the base substrate 1. Moreover, a plane portion 75 is formed on the periphery of the third concave portion 74.

The third bonding electrode 73 may include a first conductor layer, a second conductor layer and a third conductor layer. The material of the first conductor layer and the third conductor layer may be metal titanium, and the material of the second conductor layer may be metal aluminum. The third bonding electrode 73 may also include only one conductor layer or two conductor layers or more conductor layers.

Figure 13:
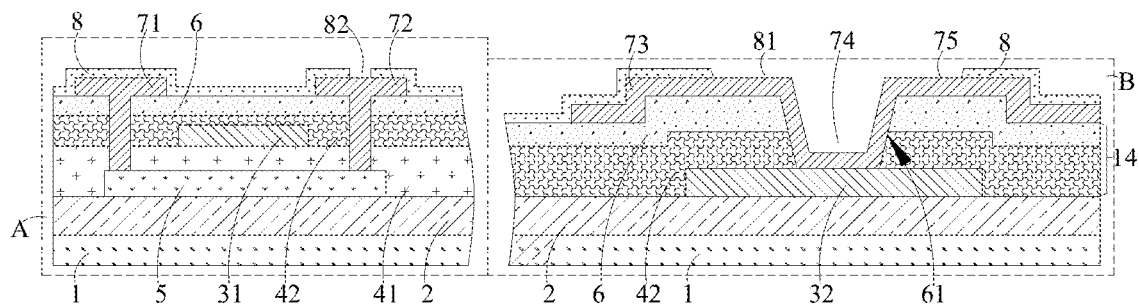
FIG. 13 is a schematic structural diagram of a step of a method for preparing a display panel according to an exemplary embodiment of the present disclosure.

Referring to FIG. 13, a protective layer 8 is disposed on a side of the third bonding electrode 73 away from the base substrate 1. A plurality of second via holes 81 are arranged on the protective layer 8. The protective layer 8 extends to a side of the plane portion 75 of the third bonding electrode 73 away from the base substrate 1. The orthographic projection of the first via hole 61 on the base substrate 1 is located within the orthographic projection of the second via hole 81 on the base substrate 1, that is, an opening area of the second via hole 81 is larger than that of the first via hole 61. Moreover, the orthographic projection of the third concave portion 74 on the base substrate 1 is located within the orthographic projection of the second via hole 81 on the base substrate 1, so that the contact area between the first bonding electrode 93 and the third bonding electrode 73 formed subsequently is relative large.

Referring to FIG. 1, the first bonding electrode 93 is disposed on a side of the protective layer 8 away from the base substrate 1, and is electrically connected with the third bonding electrode 73 through a plurality of second via holes 81. The first bonding electrode 93 may include a first conductor layer 931, and a second conductor layer 932 and a third conductor layer 933. The second conductor layer 932 is disposed between the third conductor layer 933 and the first conductor layer 931. The material of the first conductor layer 931 and the third conductor layer 933 may metal titanium, and the material of the second conductor layer 932 may metal aluminum. The first bonding electrode 93 may only include a first conductor layer 931 and a second conductor layer 932, the first conductor layer 931 covering the second conductor layer 932, that is, the first conductor layer 931 being disposed on a side of the second conductor layer 932 away from the base substrate 1. The metal activity of the first conductor layer 931 is lower than that of the second conductor layer 932, where the second conductor layer 932 is easy to undergo the replacement reaction with Ag+s (silver ions) in the etching solution. The "metal activity" refers to the tendency (e.g. difficulty) of metal elements to lose electrons in the same solution (e.g. water) to form metal cations. The materials of the first conductor layer 931, the second conductor layer 932 and the third conductor layer 933 are only examples and do not constitute the limitation of the present application.

Due to the large thickness of the second gate insulating layer 42 and the interlayer dielectric layer 6, the depth of the first via hole 61 formed on the second gate insulating layer 42 and the interlayer dielectric layer 6 is relative deep, and the first bonding electrode 93 formed subsequently will form the second concave portion 94 at the first via hole 61. The orthographic projection of the second concave portion 94 on the base substrate 1 is located within the orthographic projection of the first via hole 61 on the base substrate 1. The film-forming quality of the first bonding electrode 93 formed at the first via hole 61, in particular the film-forming quality of the first conductor layer 931 formed at a side wall and a bottom corner of the first via hole 61 is poor, and in addition, the thickness of the first conductor layer 931 is relatively thin, therefore the finally formed first conductor layer 931 has a disconnection portion 934, being not able to cover the second conductor layer 932. As shown in FIG. 1, the first conductor layer 931 is formed with two disconnection portions 934 at the bottom corners of the second concave portion 94, being not able to cover the second conductor layer 932 and resulting in the expose of the aluminum of the second conductor layer 932. During the subsequent anodic etching process, the Ag+s (silver ions) in the etching solution will undergo the replacement reaction with the exposed Al to form Ag elemental particles, and the Ag elemental particles will travel to the display area A of the display panel during the process, resulting in poor display dark spots. Moreover, a fourth concave portion 935 will be formed on the second conductor layer 932 opposite to the disconnection portion 934 due to the action of the etching solution, that is, the fourth concave portion 935 will be formed on the portion of second conductor layer 932 which is not covered by the first conductor layer 931. One, two or more fourth concave portions 935 may be formed, and when two or more fourth concave portions 935 are formed, there is a part of the first conductor layer 931 remaining between the two adjacent fourth concave portions 935.

Figure 3:
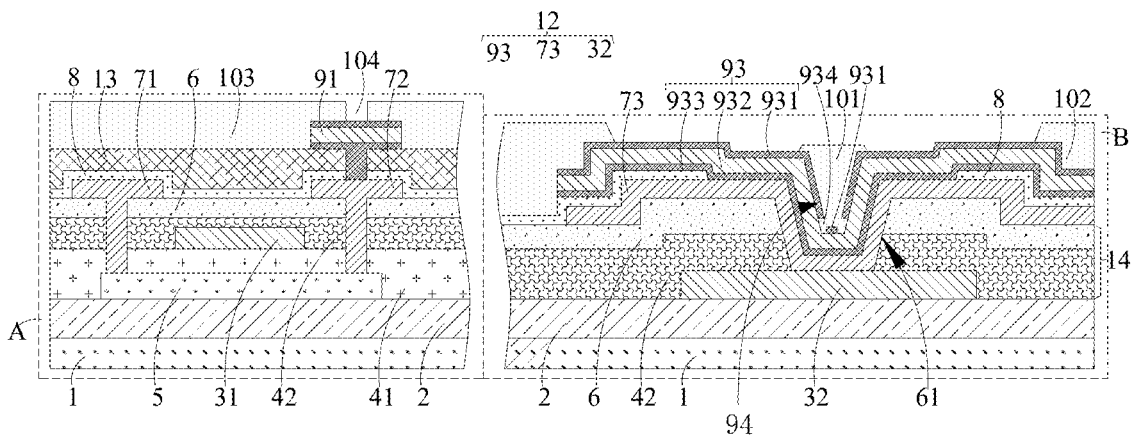
FIG. 3 is a schematic structural diagram of a display panel according to an exemplary embodiment of the present disclosure.

Referring to FIG. 3, FIG. 4, FIG. 5 and FIG. 6, the filling portion 101 is provided on a side of the second concave portion 94 away from the base substrate 1, and the filling portion 101 is at least partially located within the second concave portion 94. For example, as shown in FIG. 3, the orthographic projection of the second concave portion 94 on the base substrate 1 may be located within the orthographic projection of the filling portion 101 on the base substrate 1, that is, the filling portion 101 dose not only cover the second concave portion 94, but also extends outside the edge of the second concave portion 94 to cover the edge of the second concave portion 94. In this case, the filling portion 101 certainly covers the side wall of the second concave portion 94 to protect the exposed second conductor layer 932, avoiding that during the subsequent anodic etching process the Ag+s (silver ions) in the etching solution undergoes the replacement reaction with the exposed Al to generate Ag elemental particles, thereby avoiding poor display dark spots caused by the Ag elemental particles traveling to the display area A of the display panel during the process. Moreover, the provided filling portion 101 can increase the structural strength of the bonding pin 12 to further prevent the bonding pin 12 from breaking during the bonding process.

Figure 4:
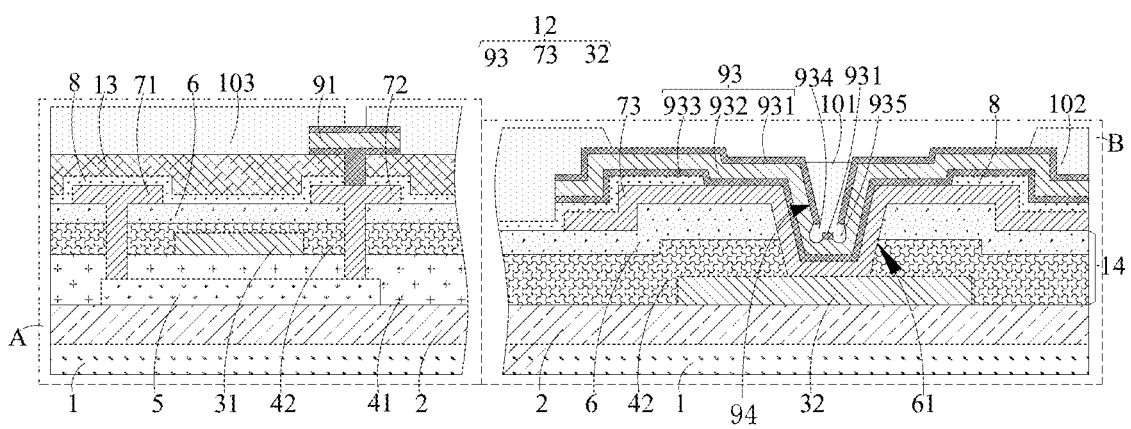
FIG. 4 is a schematic structural diagram of a display panel according to another exemplary embodiment of the present disclosure.
Figure 5:
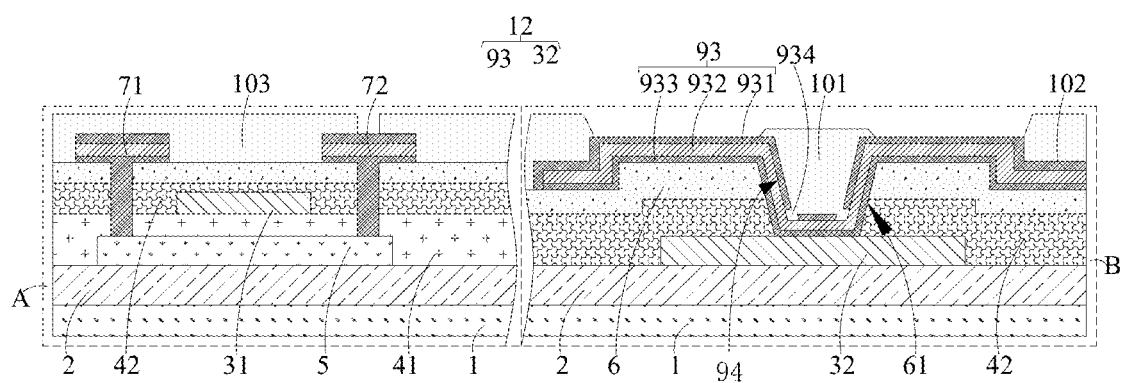
FIG. 5 is a schematic structural diagram of a display panel according to yet another exemplary embodiment of the present disclosure.
Figure 6:
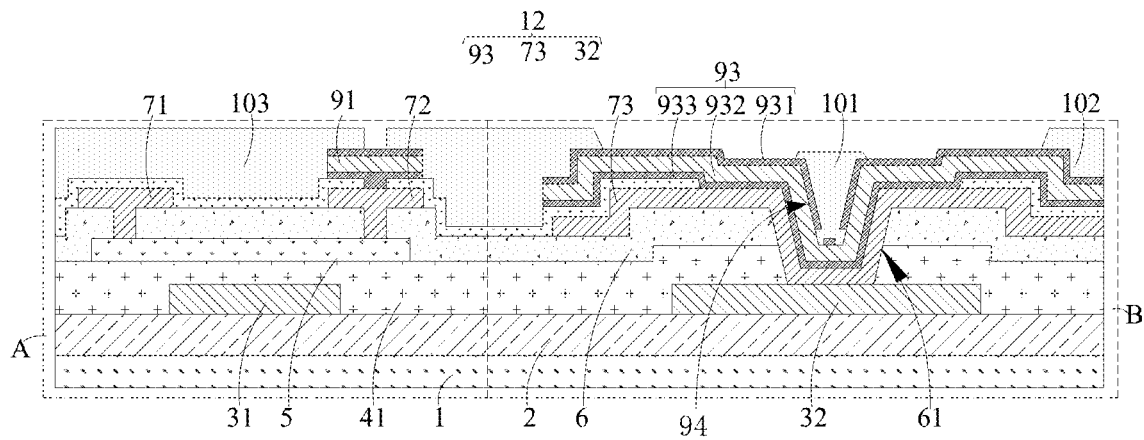
FIG. 6 is a schematic structural diagram of a display panel according to yet another exemplary embodiment of the present disclosure.
Figure 8:
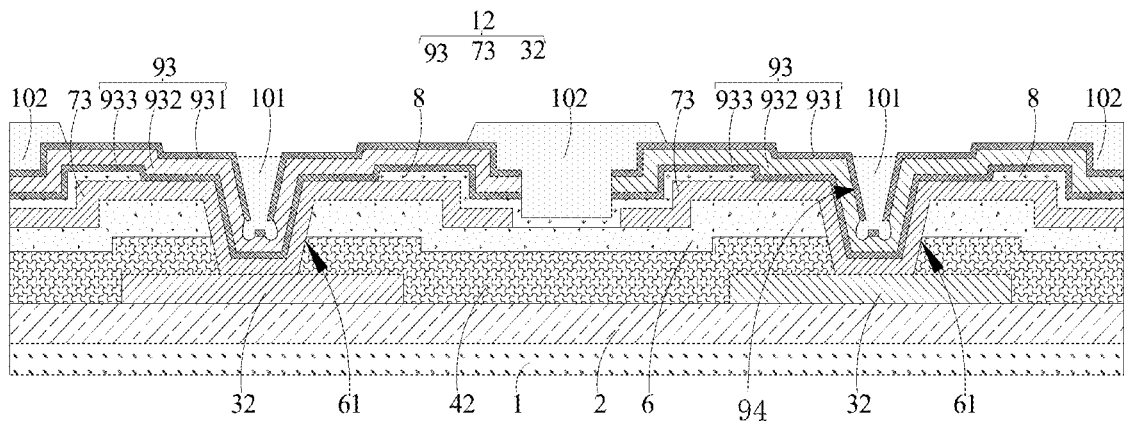
FIG. 8 is a schematic cross-sectional diagram along the H-H section in FIG. 7.

Referring to FIG. 3, FIG. 5 and FIG. 6, since the filling portion 101 protects the second conductor layer 932, during the subsequent anodic etching process the etching solution will not etch the second conductor layer 932, therefore the fourth concave portion 935 will not be formed. Referring to FIG. 4, FIG. 8 and FIG. 9, in other embodiments, the fourth concave portion 935 may be formed due to the poor film-forming quality of the second conductor layer 932 formed at the second concave portion 94.

In addition, the orthographic projection of the second concave portion 94 on the base substrate 1 overlaps with the orthographic projection of the filling portion 101 on the base substrate 1, that is, the filling portion 101 only covers the second concave portion 94. In this case, the filling portion 101 certainly covers the side wall of the second concave portion 94 to protect the exposed second conductor layer 932 to avoid that during the subsequent anodic etching process the Ag+s (silver ions) in the etching solution undergoes the replacement reaction with the exposed Al to generate Ag elemental particles, and to avoid poor display dark spots caused by the Ag elemental particles traveling to the display area A of the display panel during the process. Moreover, the provided filling portion 101 can increase the structural strength of the bonding pin 12 to further prevent the bonding pin 12 from breaking during the bonding process.

Referring to FIG. 4, the orthographic projection of the filling portion 101 on the base substrate 1 may be slightly smaller than the orthographic projection of the second concave portion 94 on the base substrate 1, and the effect of protecting the first bonding electrode 93 may also be achieved.

In addition, the protective layer 8 extends to a side of the plane portion 75 of the third bonding electrode 73 away from the base substrate 1, so that the base formed by the first bonding electrode 93 is not a plane, which is lower at a location close to a third concave portion 74 and higher at a location away from the third concave portion 74. Therefore, the height of the part of the subsequently formed first bonding electrode 93 close to the second concave portion 94 is lower, and the height of the part of the subsequently formed first bonding electrode 93 away from the second concave portion 94 is higher. In this way, a vertical distance from a surface on a side of the subsequently formed filling portion 101 away from the base substrate 1 to the base substrate 1 is less than or equal to a vertical distance from at least part of the surface on a side of the first bonding electrode 93 away from the base substrate 1 to the base substrate 1. That is, the surface of the filling portion 101 away from the base substrate 1 is substantially in a same plane as at least part of the surface of the first bonding electrode 93 away from the base substrate 1, or the height of the filling portion 101 is lower than the height of at least part of the first bonding electrode 93, which is convenient for the subsequent bonding.

It should be noted that the structure of the bonding pin 12 is not limited to the above description. For example, as shown in FIG. 5, the bonding pin 12 may include the first bonding electrode 93 and the second bonding electrode 32, but not include the third bonding electrode 73. The second bonding electrode 32 is disposed on a side of the base substrate 1. A second gate insulating layer 42 is disposed on a side of the second bonding electrode 32 away from the base substrate 1. An interlayer dielectric layer 6 is disposed on a side of the second gate insulating layer 42 away from the base substrate 1. A plurality of first via holes 61 are provided on the second gate insulating layer 42 and the interlayer dielectric layer 6, and the first via holes 61 are connected the second bonding electrode 32, that is, the first via holes 61 penetrate the second gate insulating layer 42 and the interlayer dielectric layer 6.

The first bonding electrode 93 is disposed on a side of the interlayer dielectric layer 6 away from the base substrate 1 and electrically connected to the second bonding electrode 32 through a plurality of first via holes 61.

Due to the large thickness of the second gate insulating layer 42 and the interlayer dielectric layer 6, the depth of the first via hole 61 formed on the second gate insulating layer 42 and the interlayer dielectric layer 6 is relative deep. The first bonding electrode 93 formed subsequently will form the second concave portion 94 at the first via hole 61. The orthographic projection of the second concave portion 94 on the base substrate 1 is located within the orthographic projection of the first via hole 61 on the base substrate 1. The film-forming quality of the first bonding electrode 93 formed at the first via hole 61, in particular the film-forming quality of the first conductor layer 931 formed at a side wall and a bottom corner of the first via hole 61 is poor, and in addition, the thickness of the first conductor layer 931 is relatively thin, therefore the finally formed first conductor layer 931 has a disconnection portion 934, being not able to cover the second conductor layer 932. For example, the first conductor layer 931 is formed with a disconnection portion 93 at a bottom corner of the second concave portion 944, being not able to cover the second conductor layer 932, that is, the first conductor layer 931 at a bottom corner of the second concave portion 94 cannot cover the second conductor layer 932, so that the aluminum of the second conductor layer 932 is exposed. During the subsequent anodic etching process, the Ag+s (silver ions) in the etching solution will undergo the replacement reaction with the exposed Al to form Ag elemental particles, and the Ag elemental particles will travel to the display area A of the display panel during the process, resulting in poor display dark spots.

The filling portion 101 is provided on a side of the second concave portion 94 away from the base substrate 1, and is at least partially located within the second concave portion 94. For example, the orthographic projection of the second concave portion 94 on the base substrate 1 may be located within the orthographic projection of the filling portion 101 on the base substrate 1, that is, the filling portion 101 dose not only cover the second concave portion 94, but also extends outside the edge of the second concave portion 94 to cover the edge of the second concave portion 94. In this case, the filling portion 101 certainly covers the side wall of the second concave portion 94 to protect the exposed second conductor layer 932, avoiding that during the subsequent anodic etching process the Ag+s (silver ions) in the etching solution undergoes the replacement reaction with the exposed Al to form Ag elemental particles, and avoid poor display dark spots caused by the Ag elemental particles traveling to the display area A of the display panel during the process. Moreover, the provided filling portion 101 can increase the structural strength of the bonding pin 12 to further prevent the bonding pin 12 from breaking during the bonding process.

The orthographic projection of the second concave portion 94 on the base substrate 1 may overlap with the orthographic projection of the filling portion 101 on the base substrate 1. That is, the filling portion 101 only covers the second concave portion 94. In this case, the filling portion 101 certainly covers the side wall of the second concave portion 94 to protect the exposed second conductor layer 932.

The orthographic projection of the filling portion 101 on the base substrate 1 may be slightly smaller than the orthographic projection of the second concave portion 94 on the base substrate 1, and the effect of protecting the first bonding electrode 93 may also be achieved.

In addition, the bonding pin 12 may only include the first bonding electrode 93. For example, in the case that the first concave portion 61 which may not be a via hole is provided on the insulating layer group 14 and the first bonding electrode 93 needs to be formed on a side of the first concave portion 61 away from the base substrate 1, the first bonding electrode 93 may also be formed with a second concave portion 94. Due to the poor film-forming quality, the situation that the second conductor layer 932 is not covered by the first conductor layer 931 at the second concave portion 94 may occur. Therefore, the filling portion 101 is provided on the first bonding electrode 93 to fill and protect the second concave portion 94 on the first bonding electrode 93, avoiding that during the subsequent anodic etching process the Ag+s (silver ions) in the etching solution undergoes the replacement reaction with the exposed Al to form Ag elemental particles, thereby avoiding poor display dark spots caused by the Ag elemental particles traveling to the display area A of the display panel during the process.

Referring to FIGS. 7 and 8, the display panel may further include an insulating portion 102, which is arranged between two adjacent bonding pins 12. A vertical distance from a surface on a side of the insulating portion 102 away from the base substrate 1 to the base substrate 1 is equal to or greater than a vertical distance from a surface on a side of the filling portion 101 away from the base substrate 1 to the base substrate 1. The insulating portion 102 plays a role of insulating the two adjacent bonding pins 12. The surfaces of the insulating portion 102 and the bonding pin 12 away from the base substrate 1 are substantially in a same plane, that is, the heights of the insulating portion 102 and the bonding pin 12 with respect to the base substrate 1 are substantially equal. Alternatively, the surface on a side of the insulating portion 102 away from the base substrate 1 is higher than the surface on a side of the filling portion 101 away from the base substrate 1, that is, the height of the insulating portion 102 is higher than the height of the filling portion 101.

It should be noted that the "height" is a vertical distance from the surface on a side of the structure (for example, the insulating portion 102) away from the base substrate 1 to the base substrate 1.

With the increase of the thickness of the insulating portion 102, the structural strength of the gap portion between the bonding pins 12 of the display panel located in different rows may be increased, thereby further preventing the gap portion between the bonding pins 12 of the display panel located in different rows from breaking during the bonding process.

The bonding area B of the display panel is described above, and the display area A of the display panel is described below.

In the display area A, the display panel may include a plurality of pixel units arranged in an array, each pixel unit includes at least three sub-pixels, and each sub-pixel includes a thin film transistor and a display element.

Specifically, the structure of the thin film transistor is that: an active layer 5 is disposed on a side of the buffer layer 2 away from the base substrate 1. The first gate insulating layer 41 is disposed on a side of the active layer 5 away from the base substrate 1, the material of the first gate insulating layer 41 may be one or two of silicon oxide and silicon nitride, and the first gate insulating layer is provided with a fourth via hole which is connected to the active layer. A gate electrode 31 is disposed on a side of the first gate insulating layer 41 away from the base substrate 1, and the material of the gate electrode 31 may be molybdenum, nickel, nickel-manganese alloy, nickel-chromium alloy, nickel-molybdenum-iron alloy, etc. The second gate insulating layer 42 is disposed on a side of the gate electrode 31 away from the base substrate 1, the material of the second gate insulating layer 42 may be one or two of silicon oxide and silicon nitride, and a fifth via hole is provided on the second gate insulating layer 42, being connected to the fourth via hole. An interlayer dielectric layer 6 is disposed on a side of the second gate insulating layer 42 away from the base substrate 1, the material of the interlayer dielectric layer 6 may be silicon oxide, and a sixth via hole is provided on the interlayer dielectric layer 6, being connected to the fourth via hole and connected to the active layer 5. A source electrode 71 and a drain electrode 72 are disposed on a side of the interlayer dielectric layer 6 away from the base substrate 1, which are connected to the active layer 5 through the sixth via hole, the fifth via hole and the fourth via hole, and the source electrode 71 and the drain electrode 72 may be made of Ti, Al, and Ti (i.e., three layers of titanium, aluminum, and titanium). The protective layer 8 is disposed on a side of the source electrode 71 and drain electrode 72 away from the base substrate 1, and a seventh via hole 82 is provided on the protective layer 8, which can be connected to the source electrode 71 or drain electrode 72. A first planarization layer 13 is disposed on a side of the protective layer 8 away from the base substrate 1, and an eighth via hole is provided on the first planarization layer 13, being connected the seventh via hole. A connection electrode 91 is disposed on a side of the first planarization layer 13 away from the base substrate 1, being connected to the source electrode 71 or drain electrode 72 through the seventh via hole and the eighth via hole.

A second planarization layer 103 is disposed on a side of the connection electrode 91 away from the base substrate 1, a third via hole 104 is provided on the second planarization layer 103. A display element (not shown) is provided on a side of the second planarization layer 103 away from the base substrate 1, and the display element is connected to the connection electrode 91 through the third via hole 104.

The thin film transistor described above is a top gate type, and in other exemplary embodiments of the present disclosure, the thin film transistor may also be a bottom gate type (referring to FIG. 6) or a double gate type.

The second bonding electrode 32 is disposed in a same layer and made of a same material as the gate electrode 31, the third bonding electrode 73 is disposed in a same layer and made of a same material as the source electrode 71 and the drain electrode 72, and the first bonding electrode 93 is disposed in a same layer and made of a same material as the connection electrode 91. The filling portion 101 and the insulating portion 102 are disposed in a same layer and made of a same material as the second planarization layer 103.

In the case that the third bonding electrode 73 is not provided, the first bonding electrode 93 may be disposed in a same layer and made of a same material as the source electrode 71 and drain electrode 72.

It should be noted that the so-called being disposed in a same layer and made of a same material refers to being formed through a same composition process, which will be described in detail in the method for preparing the display panel below.

Figure 10:
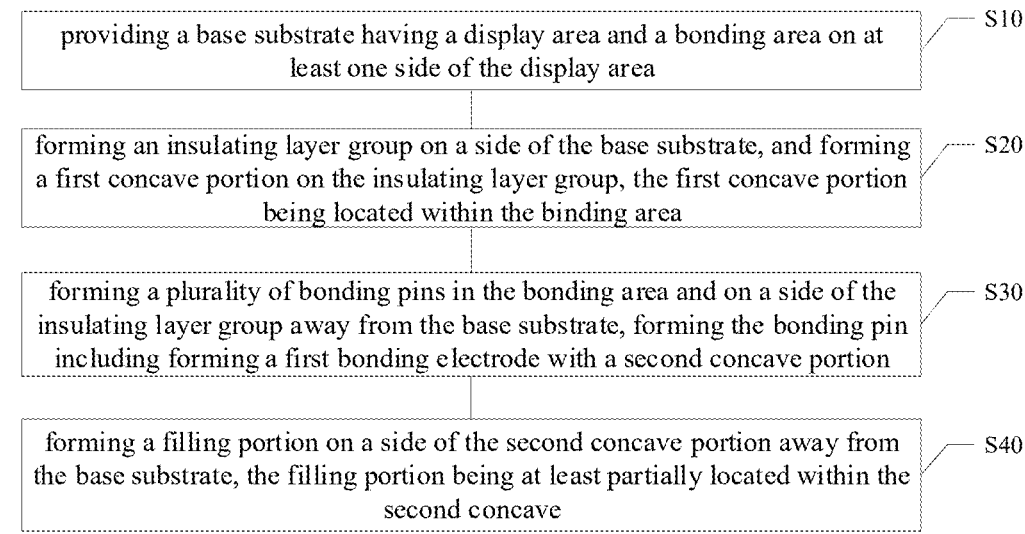
FIG. 10 is a schematic flow diagram of a method for preparing a display panel according to an exemplary embodiment of the present disclosure.

Further, the embodiments of the present disclosure provide a method for preparing a display panel, and referring to the flow diagram of the method for preparing the display panel shown in FIG. 10, the method for preparing the display panel may include the following steps.

At step S10, providing a base substrate 1 having a display area A and a bonding area B on at least one side of the display area A.

At step S20, forming an insulating layer group 14 on a side of the base substrate 1, and forming a first concave portion 61 on the insulating layer group 14, the first concave portion 61 being located within the bonding area B.

At step S30, forming a plurality of bonding pins 12 in the bonding area B and on a side of the insulating layer group 14 away from the base substrate 1, forming the bonding pin 12 including forming a first bonding electrode 93 with a second concave portion 94.

In step S40, forming a filling portion 101 on a side of the second concave portion 94 away from the base substrate 1, the filling portion 101 being at least partially located within the second concave portion 94.

An orthographic projection of the second concave portion 94 on the base substrate 1 is located within an orthographic projection of the first concave portion 61 on the base substrate 1. The first bonding electrode 93 includes at least a first conductor layer 931 and a second conductor layer 932 that are disposed in a laminated manner. The first conductor layer 931 is disposed on a side of the second conductor layer 932 away from the base substrate 1. The metal activity of the first conductor layer 931 is lower than the metal activity of the second conductor layer 932.

Referring to FIG. 11 to FIG. 15, each step of the method for preparing the display panel is described in detail below.

Referring to FIG. 11, a base substrate 1 is provided, and a buffer layer 2 is deposited on a side of the base substrate 1.

An active material layer is deposited on a side of the buffer layer 2 away from the base substrate 1, and the material of the active material layer may be SiN, SiO or a-Si (amorphous silicon). The thickness of SiN is greater than or equal to 0.3 m and less than or equal to 0.7 m. The thickness of SiO is greater than or equal to 1.0 m and less than or equal to 1.2 m. The thickness of a-Si is about 0.05 m. Then, the active material layer is dehydrogenated to avoid hydrogen explosion during the excimer laser crystallization (ELA) process, and the dehydrogenation condition may range from 300° C. to 350° C. After dehydrogenation, the excimer laser crystallization process is carried out to convert amorphous silicon into polycrystalline silicon. Finally, a digital exposure machine or mask is used to form a silicon island mask, the active material layer is dry etched, where CF4+O2 may be used for dry etching, and then, the silicon island mask is wet stripped to form a silicon island pattern (the active layer 5). The mask is formed in a channel area, and ion implantation is performed in a non-channel area to make polycrystalline silicon doped and conductive to finally form the active layer 5, where phosphine or borane may be used for doping.

The first gate insulating layer 41 is deposited on a side of the active layer 5 away from the base substrate 1, and the first gate insulating layer 41 is etched to form a fourth via hole which is connected to the active layer 5. A gate material layer is deposited on a side of the first gate insulating layer 41 away from the base substrate 1, and the material of the gate material layer may be molybdenum, nickel, nickel-manganese alloy, nickel-chromium alloy, nickel-molybdenum-iron alloy, etc. The thickness of the gate material layer is greater than or equal to 0.25 m and less than or equal to 0.3 m. The digital exposure machine or mask is used to form a gate electrode mask, and then CF4+O2 is used for dry etching to form a gate electrode 31 in the display area A and to form a second bonding electrode 32 in the bonding area B, where a high CF4+low O2 dry etching mixed gas can be used. Specifically, the flow rate of CF4 may be 2000 sccm 2500 sccm (i.e., standard cubic meter per minute), and the flow rate of O2 may be 1000 sccm 1500 sccm. Then, the gate electrode mask is wet stripped.

Referring to FIG. 12, a second gate insulating layer 42 is deposited on a side of the gate electrode 31 away from the base substrate 1.

An interlayer dielectric layer 6 is deposited on a side of the second gate insulating layer 42 away from the base substrate 1, the interlayer dielectric layer 6 in the display area A is etched to form a sixth via hole, and at the same time, the second gate insulating layer 42 is etched to form a fifth via hole, where the sixth via hole is connected to the fifth via hole and the fourth via hole. At the same time, the interlayer dielectric layer 6 and the second gate insulating layer 42 of the bonding region B (the interlayer dielectric layer 6 and the second gate insulating layer 42 of the bonding region B form the insulating layer group 14) are etched to form a first via hole 61 which is connected to the second bonding electrode 32. The first via hole 61 may be a square shape, that is, the cross section of the first via hole 61 parallel to the base substrate 1 may be a square shape, and the length of the side of the first via hole 61 is greater than or equal to 2 m and less than or equal to 3 m. The first via hole 61 may also be a circular shape, that is, the cross section of the first via hole 61 parallel to the base substrate 1 may be a circular shape, and the diameter of the first via hole 61 is greater than or equal to 2 m and less than or equal to 3 m. The first via hole 61 may be other shapes, which will not be elaborated herein.

The first conductor layer 931, the second conductor layer 932 and the third conductor layer 933 are sequentially deposited on a side of the interlayer dielectric layer 6 away from the substrate 1, where the first conductor layer 931, the second conductor layer 932 and the third conductor layer 933 form a source and drain metal layer. The material of the source and drain metal layer is Ti—Al—Ti, that is, the material of the first conductor layer 931 is Ti, the material of the second conductor layer 932 is Al, and the material of the third conductor layer 933 is Ti. Then, the source and drain metal layer is etched to form the source electrode 71 and the drain electrode 72 in the display area A, and to form the third bonding electrode 73 in the bonding area B. The source electrode 71, the drain electrode 72 and the third bonding electrode 73 may be a structure of one or two conductive layers.

Referring to FIG. 13, the protective layer 8 is formed on a side of the source electrode 71, the drain electrode 72 and the third bonding electrode 73 away from the base substrate 1. The protective layer 8 is etched to form a seventh via hole 82 in the display area A and a second via hole 81 in the bonding area B.

Referring to FIG. 1, in the display area, a first planarization layer 13 is deposited on a side of the protective layer 8 away from the base substrate 1, and the first planarization layer 13 is etched to form an eighth via hole. Then, the first conductor layer 931, the second conductor layer 932 and the third conductor layer 933 are sequentially deposited on a side of the first planarization layer 13 and the protective layer 8 away from the base substrate 1, where the first conductor layer 931, the second conductor layer 932 and the third conductor layer 933 form a connection electrode layer. The connection electrode layer is etched to form a connection electrode 91 in the display area A which is connected to the source electrode 71 or drain electrode 72 through the seventh via hole and the eighth via hole, and at the same time a first bonding electrode 93 is formed in the bonding area B, which is connected to the third bonding electrode 73 through the second via hole 81.

Figure 14:
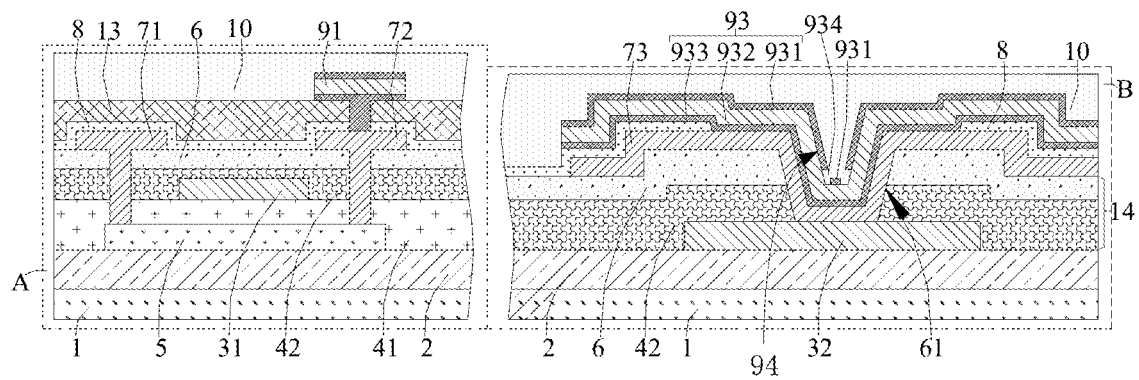
FIG. 14 is a schematic structural diagram of a step of a method for preparing a display panel according to an exemplary embodiment of the present disclosure.

Referring to FIG. 14, a flat material layer 10 is formed on a side of the connection electrode 91 and the first bonding electrode 93 away from the base substrate 1. The flat material layer 10 is etched to form a third via hole 104 in the display area A and to form a filling portion 101 and an insulating portion 102 in the bonding area B, and a gap is formed between the filling portion 101 and the insulating portion 102.

The material of the flat material layer 10 may be positive photoresist.

The specific etching process of the flat material layer 10 is as follows.

Figure 15:
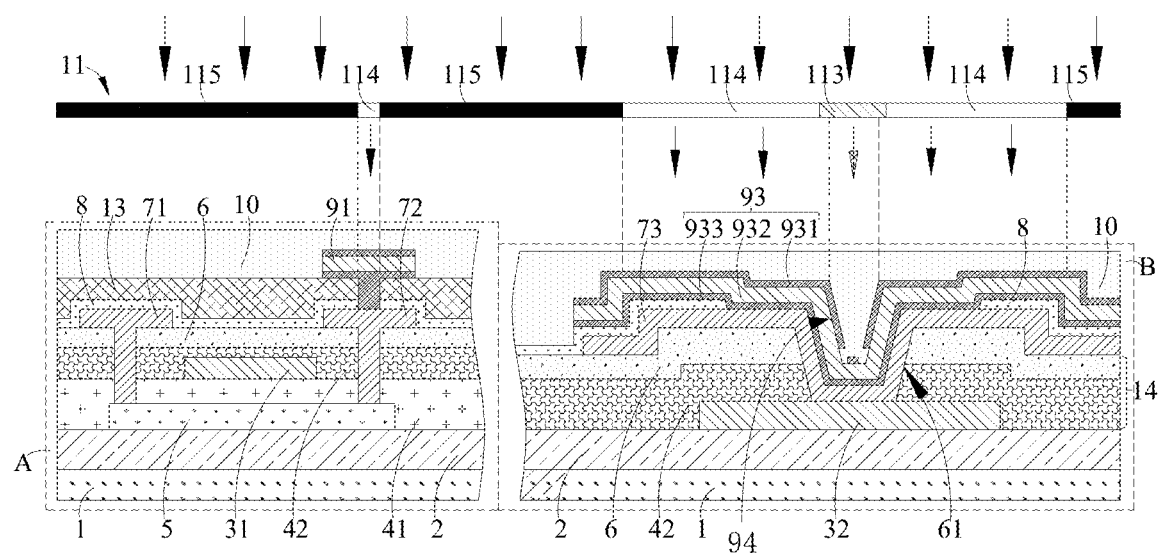
FIG. 15 is a schematic structural diagram of a step of a method for preparing a display panel according to an exemplary embodiment of the present disclosure.

As shown in FIG. 15, a mask 11 is covered on a side of the flat material layer 10 away from the base substrate 1, the mask 11 has a full light transmission area 114, a semi light transmission area 113 and an opaque area 115. The light transmission rate of the full light transmission area 114 is about 100%, the light transmission rate of the semi light transmission area 113 is greater than or equal to 20% and less than or equal to 70%, and the light transmission rate of the opaque area 115 is about 0%. The orthographic projection of the full light transmission area 114 on the base substrate 1 substantially overlaps with the orthographic projections of the third via hole 104 and the gap on the base substrate 1. The orthographic projection of the second concave portion 94 on the base substrate 1 is located within the orthographic projection of the semi light transmission area 113 on the base substrate 1. The rest part is the opaque area 115.

The flat material layer 10 covered with the mask 11 is exposed and developed, the flat material layer 10 opposite to the full light transmission area 114 is completely removed to form the third via hole 104 and gap, and the flat material layer 10 opposite to the semi light transmission area 113 is partially removed to form the filling portion 101. Since the orthographic projection of the second concave portion 94 on the base substrate 1 is located within the orthographic projection of the semi light transmission area 113 on the base substrate 1, the orthographic projection of the second concave portion 94 on the base substrate 1 is located within the orthographic projection of the formed filling portion 101 on the base substrate 1. Specifically, a distance between the edge of the orthographic projection of the second concave portion 94 on the base substrate 1 and the edge of the orthographic projection of the filling portion 101 on the base substrate 1 is greater than or equal to 1 m and less than or equal to 2.5 m.

Figure 16:
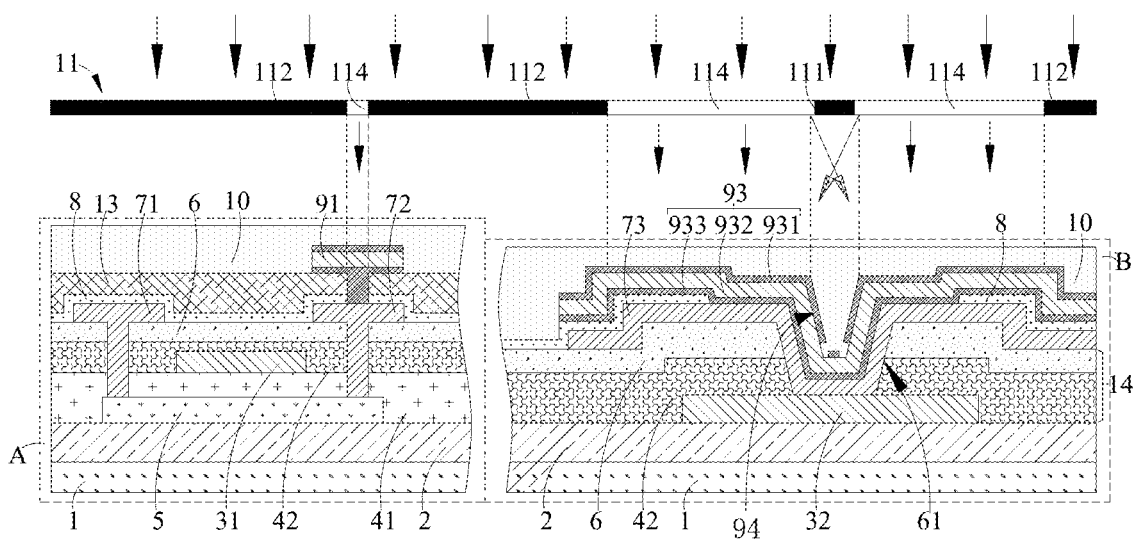
FIG. 16 is a schematic structural diagram of one step of a method for preparing a display panel according to another exemplary embodiment of the present disclosure.

In addition, in other exemplary embodiments of the present disclosure, as shown in FIG. 16, the mask 11 has a first opaque area 111, a second opaque area 112 and a full light transmission area 114, where the full light transmission area 114 is between the first opaque area 111 and the second opaque area 112. The first opaque area 111 is arranged opposite to the second concave portion 94, the orthographic projection of the first opaque area 111 on the base substrate 1 is located within the orthographic projection of the second concave portion 94 on the base substrate 1, specifically, a distance between the edge of the orthographic projection of the first opaque area 111 on the base substrate 1 and the edge of the orthographic projection of the second concave portion 94 on the base substrate 1 is greater than or equal to 0 m and less than or equal to 0.5 m. Since the length of the side of the first via hole 61 is greater than or equal to 2 m and less than or equal to 3 m, the length of the side of the second concave portion 94 formed by means of the first via hole 61 being filled by the first bonding electrode 93 will be smaller, whereas the first opaque area 111 is smaller than the length of the side of the second concave portion 94, therefore, when the flat material layer 10 is exposed and developed, the light will be emitted to the flat material layer 10 opposite to the first opaque area 111 due to diffraction, and the flat material layer 10 opposite to the first opaque area 111 is partially removed after light irradiation to form a filling portion 101 filling the second concave portion 94.

The orthographic projection of the second concave portion 94 on the base substrate 1 may overlap with the orthographic projection of the semi light transmission area 113 on the base substrate 1, and the orthographic projection of the first opaque area 111 on the base substrate 1 may also overlap with the orthographic projection of the second concave portion 94 on the base substrate 1, so that the orthographic projection of the formed filling portion 101 on the base substrate 1 overlaps with the orthographic projection of the second concave portion 94 on the base substrate 1.

It should be noted that although each step of the method for preparing the display panel in the present disclosure are described in a specific order in the drawings, this does not require or imply that these steps must be performed in the specific order, or that all the steps shown must be performed to achieve the desired result. Additionally or alternatively, some steps can be omitted, multiple steps can be combined into one step for execution, and/or one step can be decomposed into multiple steps for execution, etc.

Further, the embodiment of the present disclosure also provides a display device, which may include the display panel described in any one of the above. The specific structure of the display panel has been described in detail above, therefore it will not be elaborated herein.

The specific type of the display device is not particularly limited, specifically for example mobile devices such a mobile phone, wearable devices such as a watch, VR devices, etc., and those skilled in the art can choose accordingly according to the specific purpose of the display device, which will not be elaborated herein.

It should be noted that in addition to the display panel, the display device also includes other necessary components and constitution, taking a display as an example, specifically for example a shell, a circuit board, a power cord, etc., and those skilled in the art can make corresponding supplements accordingly according to the specific use requirements of the display device, which will not be elaborated herein.

Compared with the related art, the beneficial effect of the display device provided by the example embodiment of the present invention is the same as that of the display panel provided by the above example embodiment, which will not be elaborated herein.

A person skilled in the art, after considering the description and practicing the present invention disclosed herein, will easily anticipate other embodiments of the present disclosure. The present application is intended to cover any modification, use or adaptive change of the present disclosure, which follows the general principle of the present disclosure and includes the common general knowledge or frequently used technical means in the technical field that is not disclosed in the present disclosure. The description and embodiments are only considered exemplary, and the true scope and spirit of the present disclosure are indicated by the appended claims.

What is claimed is:

1. A display panel, comprising:
    a base substrate with a display area and a bonding area provided on at least one side of the display area;
    an insulating layer group on one side of the base substrate and with a first concave portion, the first concave portion being in the bonding area; and
    a plurality of bonding pins in the bonding area, wherein at least one of the plurality of bonding pins comprises:
        a first bonding electrode on a side, away from the base substrate, of the insulating layer group, and with a second concave portion, an orthographic projection of the second concave portion on the base substrate being within an orthographic projection of the first concave portion on the base substrate, wherein the first bonding electrode comprises:
            at least a first conductor layer and a second conductor layer disposed in a laminated manner, the first conductor layer being on a side, away from the base substrate, of the second conductor layer, metal activity of the first conductor layer being lower than metal activity of the second conductor layer; and
        a filling portion on a side, away from the base substrate, of the second concave portion, being at least partially within the second concave portion;
    wherein the first conductor layer has a disconnection portion, the disconnection portion being within the second concave portion, and on a side wall of the first conductor layer at a position of the second concave portion, and wherein the disconnection portion allows part of the second conductor layer to be exposed and to be in contact with the filling portion.

2. The display panel according to claim 1, wherein the at least one of the plurality of bonding pins further comprises:
    a second bonding electrode between the base substrate and the first bonding electrode, being connected with the first bonding electrode through a first via hole, the first concave portion being the first via hole.

3. The display panel according to claim 2, wherein the at least one of the plurality of bonding pins further comprises:
    a third bonding electrode between the first bonding electrode and the second bonding electrode and with a third concave portion, the orthographic projection of the second concave portion on the base substrate being within an orthographic projection of the third concave portion on the base substrate, and the orthographic projection of the third concave portion on the base substrate being within the orthographic projection of the first concave portion on the base substrate.

4. The display panel according to claim 3, further comprising:
    a protective layer between the first bonding electrode and the third bonding electrode and with a second via hole, the third bonding electrode being connected with the first bonding electrode through the second via hole.

5. The display panel according to claim 4, wherein the orthographic projection of the third concave portion on the base substrate is within an orthographic projection of the second via hole on the base substrate.

6. The display panel according to claim 4, further comprising:
    an insulating portion between two adjacent bonding pins, wherein a vertical distance from a surface on a side of the insulating portion away from the base substrate to the base substrate is equal to or greater than a vertical distance from a surface on a side of the filling portion away from the base substrate to the base substrate.

7. The display panel according to claim 6, further comprising:
    a plurality of sub-pixels in the display area, at least one of the plurality of sub-pixels comprising a thin film transistor, a planarization layer with a third via hole, and a display element, wherein
        the planarization layer is on a side, away from the base substrate, of the thin film transistor, and covers the thin film transistor;
        the display element is on a side, away from the base substrate, of the planarization layer; and
        the thin film transistor comprises an active layer, a gate electrode, a source electrode, a drain electrode and a connection electrode, the source electrode and drain electrode being electrically connected with the active layer, the connection electrode being electrically connected with the source electrode or the drain electrode, and the connection electrode being electrically connected with the display element through the third via hole.

8. The display panel according to claim 7, wherein:
    the active layer is on a side of the base substrate;
    the gate electrode is on a side, away from the base substrate, of the active layer;

the source electrode and the drain electrode are on a side, away from the base substrate, of the gate electrode; and the connection electrode is on a side, away from the base substrate, of the source electrode and the drain electrode.

9. The display panel according to claim 7, wherein:

the second bonding electrode is in a same layer and made of a same material as the gate electrode, the third bonding electrode is in a same layer and made of a same material as the source electrode and the drain electrode, and the first bonding electrode is in a same layer and made of a same material as the connection electrode.

10. The display panel according to claim 7, wherein the planarization layer is on a side, away from the base substrate, of the connection electrode, and the planarization layer is in a same layer and made of a same material as the filling portion and the insulating portion.

11. The display panel according to claim 7, wherein:

a buffer layer is between the base substrate and the active layer, a first gate insulating layer is between the active layer and the gate electrode, a second gate insulating layer is between the gate electrode and the source electrode and the drain electrode, and an interlayer dielectric layer is on a side, away from the base substrate, of the second gate insulating layer; and the insulating layer group is in a same layer and made of a same material as the second gate insulating layer and the interlayer dielectric layer, or the insulating layer group is in a same layer and made of a same material as the buffer layer and the first gate insulating layer.

12. The display panel according to claim 1, wherein a vertical distance, from at least part of a surface on a side of the first bonding electrode away from the base substrate, to the base substrate, is greater than or equal to, a vertical distance, from a surface on a side of the filling portion away from the base substrate, to the base substrate.

13. The display panel according to claim 1, wherein the second conductor layer has a fourth concave portion opposite to the disconnection portion.

14. The display panel according to claim 13, wherein the number of the disconnection portion is two, and the number of the fourth concave portion is two, and part of the first conductor layer is between the two fourth concave portions.

15. The display panel according to claim 1, wherein the first bonding electrode further comprises a third conductor layer, and the second conductor layer is between the third conductor layer and the first conductor layer.

16. The display panel according to claim 15, wherein the third conductor layer and the first conductor layer are made of titanium, and the second conductor layer is made of aluminum.

17. A display device, comprising a display panel, wherein the display panel comprises:

a base substrate with a display area and a bonding area provided on at least one side of the display area;

an insulating layer group on one side of the base substrate and with a first concave portion, the first concave portion being in the bonding area; and a plurality of bonding pins in the bonding area, wherein at least one of the plurality of bonding pins comprises:

a first bonding electrode on a side, away from the base substrate, of the insulating layer group, and with a second concave portion, an orthographic projection of the second concave portion on the base substrate being within an orthographic projection of the first concave portion on the base substrate, wherein the first bonding electrode comprises:

at least a first conductor layer and a second conductor layer disposed in a laminated manner, the first conductor layer being on a side, away from the base substrate, of the second conductor layer, metal activity of the first conductor layer being lower than metal activity of the second conductor layer; and a filling portion on a side, away from the base substrate, of the second concave portion, being at least partially within the second concave portion;

wherein the first conductor layer has a disconnection portion, the disconnection portion being within the second concave portion, and on a side wall of the first conductor layer at a position of the second concave portion, and wherein the disconnection portion allows part of the second conductor layer to be exposed and to be in contact with the filling portion.

18. The display device according to claim 17, wherein the at least one of the plurality of bonding pins further comprises:

a second bonding electrode between the base substrate and the first bonding electrode, being connected with the first bonding electrode through a first via hole, the first concave portion being the first via hole.

19. The display device according to claim 18, wherein the at least one of the plurality of bonding pins further comprises:

a third bonding electrode between the first bonding electrode and the second bonding electrode and with a third concave portion, the orthographic projection of the second concave portion on the base substrate being within an orthographic projection of the third concave portion on the base substrate, and the orthographic projection of the third concave portion on the base substrate being within the orthographic projection of the first concave portion on the base substrate.

* * * * *